United States Patent [19]

Ali et al.

[11] Patent Number: 4,970,692

[45] Date of Patent: Nov. 13, 1990

[54] CIRCUIT FOR CONTROLLING A FLASH EEPROM HAVING THREE DISTINCT MODES OF OPERATION BY ALLOWING MULTIPLE FUNCTIONALITY OF A SINGLE PIN

[75] Inventors: Syed Ali, Cupertino; Yoram Cedar, Sunnyvale, both of Calif.

[73] Assignee: WaferScale Integration, Inc., Fremont, Calif.

[21] Appl. No.: 483,285

[22] Filed: Feb. 20, 1990

Related U.S. Application Data

[63] Continuation of Ser. No. 91,917, Sep. 1, 1987, abandoned.

[51] Int. Cl.$^5$ .............................................. G11C 13/00
[52] U.S. Cl. ................................. 365/218; 365/189.01;
365/189.03; 365/189.05; 365/230.02;
365/230.06
[58] Field of Search ................ 365/94, 189.01, 189.05,
365/189.03, 218, 200, 230.01, 230.02, 230.03,
230.05, 230.06, 230.08

[56] References Cited

U.S. PATENT DOCUMENTS

| | | | |
|---|---|---|---|
| 4,412,309 | 10/1983 | Kuo ....................................... | 365/218 |
| 4,623,990 | 11/1986 | Allen et al. ...................... | 365/230.05 |
| 4,698,750 | 10/1987 | Wilkie et al. ......................... | 365/218 |
| 4,752,871 | 1/1988 | Sparks et al. ......................... | 365/218 |
| 4,763,305 | 8/1988 | Kuo ....................................... | 365/218 |
| 4,785,425 | 11/1988 | Lavelle ............................ | 365/189.01 |
| 4,811,294 | 3/1989 | Kobayashi et al. .................. | 365/218 |

OTHER PUBLICATIONS

Samba Murthy, "EEPROM Programs in a Flash", The Electronic System Design Magazine, Apr. 1987, pp. 78–79 and 80.

"Microprocessor Interfacing with SEEQ's Flash (TM) EEPROMS", SEEQ Technology, Incorporated, pp. 6-2 thru 6-12.

Xicor Data Book, published in May 1985, by Xicor, Inc., pp. 3-75 to 3-80.

*Primary Examiner*—Terrell W. Fears
*Attorney, Agent, or Firm*—Skjerven, Morrill, MacPherson, Franklin & Friel

[57] ABSTRACT

An EEPROM receives a first address from a microprocessor. If the first address equals a first predetermined value, the EEPROM goes into a programming mode. If the first address equals a second predetermined value, the EEPROM goes into an erase mode. The EEPROM interprets a second address received from the microprocessor as indicating the location where data is to be stored in the EEPROM. The EEPROM generates an internal write pulse which remains active until the EEPROM receives a subsequent write instruction from the microprocessor. In this way, it is not necessary to generate a wait instruction to the microprocessor to halt the microprocessor while the EEPROM is storing data. Also, it is not necessary to provide additional circuitry to control whether the EEPROM goes into the erase or programming modes.

20 Claims, 4 Drawing Sheets

CIRCUIT FOR CONTROLLING A FLASH EEPROM HAVING THREE DISTINCT MODES OF OPERATION BY ALLOWING MULTIPLE FUNCTIONALITY OF A SINGLE PIN

This application is a continuation of application Ser. No. 07/091,917, filed 09/01/87 now abandoned.

BACKGROUND OF THE INVENTION

This invention relates to electrically erasable programmable read only memories (EEPROMs), and more specifically to flash EEPROMs. (A flash EEPROM is an EEPROM which has three distinct modes of operation: a read mode in which data is read from the EEPROM, a programming mode in which data is stored in the EEPROM, and an erase mode in which the entire contents of the EEPROM are erased.)

One type of prior art memory device is a non-flash EEPROM. When it is desired to program a non-flash EEPROM, program data is provided on the EEPROM data bus, an address is provided on the EEPROM address bus, and the EEPROM automatically executes an erase cycle in which the selected address is erased, followed by a programming cycle, in which the selected address is loaded with the program data.

Another type of memory device is the flash EEPROM which can enter an erase mode independently of whether the flash EEPROM is to be programmed, or enter the programming mode independently of whether the flash EEPROM is to be erased Typically, such a flash EEPROM includes a programming voltage pin, and when a programming voltage is asserted on the programming voltage pin, the flash EEPROM will go into either the erase or programming mode. It is necessary to communicate to the flash EEPROM whether it is desired to program or erase the flash EEPROM. This is typically done by the either (1) providing an extra pin on the flash EEPROM for providing a signal indicative or whether a programing or erase operation is desired, or (2) designing one or more of the other flash EEPROM pins so that if these pins receive a signal which is in excess of conventional TTL voltage levels, the flash EEPROM will enter the erase mode, but otherwise will enter the programming mode.

It is known in the art to provide microprocessor systems including a microprocessor coupled to various devices such as EEPROMs, static RAMs, and peripheral I/O devices. The microprocessor provides a write control pulse to control the flow of data from the microprocessor to the devices connected thereto. Typical microprocessors are designed to communicate with devices which can store data in a very short time period. Thus, the write control pulse is generally on the order of approximately 100 nanoseconds long. However, it typically requires between several hundred microseconds and several milliseconds to store data in an EEPROM. Accordingly, in the prior art, additional integrated circuits are required to permit a microprocessor to store data in a flash EEPROM.

Figure 1:
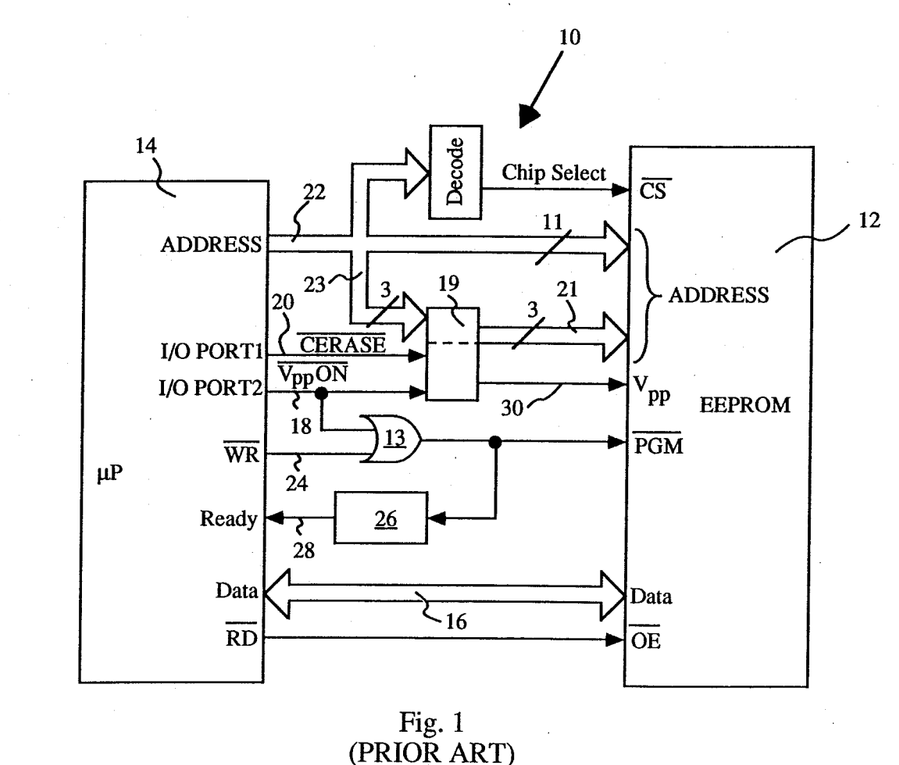
FIG. 1 schematically illustrates a circuit including a microprocessor and an EEPROM constructed in accordance with the prior art.

FIG. 1 illustrates a prior art circuit 10 including a microprocessor 14 for communicating with a flash EEPROM 12. (Typically, other devices such as static RAMs and peripheral I/O devices are also coupled to microprocessor 14, but these other devices are not shown in FIG. 1 to simplify the illustration.) The circuit of FIG. 1 is described by Samba Murthy in an article entitled "EEPROM Programs in a Flash", published in Electronic System Design Magazine in Apr. 1987, incorporated herein by reference. When it is desired to write data to EEPROM 12, microprocessor 14 provides an address on address bus 22, data on data bus 16 and a write control pulse on a write enable lead 24. Also, during write operations, the output signal on I/O output port lead 18 is active (low), and the output signal on I/O output port lead 20 is inactive (high). When the signal at lead 18 is low, a logic and switching circuit 19 raises voltage VPP from 5 to 12 volts, and the write control pulse on lead 24 is communicated to EEPROM 12 via an OR gate 13.

Eleven of the address bus lines within address bus 22 are connected directly from microprocessor 14 to EEPROM 12. A set 23 of three of address bus lines 22 are coupled to EEPROM 12 via logic and switching circuit 19. When the signal at lead 20 is inactive (e.g. during reading and writing operations), circuit 19 communicates the address signals on lines 23 to EEPROM 12.

The write pulse on lead 24 controls the timing for writing data to the various devices connected to microprocessor 14, and typically lasts on the order of 100 nanoseconds. At the conclusion of the write operation, the signal at lead 24 goes inactive and microprocessor 14 then goes on to accomplish other tasks. However, storing data in EEPROMs such as EEPROM 12 typically requires a much longer write pulse, e.g. a write pulse lasting on the order of 100 microseconds. Accordingly, circuit 10 includes a circuit 26 which provides a wait signal on a lead 28 for a predetermined time period (e.g. 100 microseconds), which causes microprocessor 14 to go into a wait state and leave the write enable signal on lead 24 in an active (low) state for the duration of the wait signal, thereby permitting EEPROM 12 to store the data provided on data bus 16. Thereafter, the wait signal on lead 28 goes inactive and microprocessor 14 resumes normal operation. Unfortunately, circuits such as circuit 26 represent an additional integrated circuit in circuit 10 and are therefore expensive and undesirable. In addition, by causing microprocessor 14 to enter the wait state, microprocessor 14 is unable to perform other tasks while waiting for EEPROM 12 to store data.

It is also necessary to be able to cause flash EEPROM 12 to go into an erase mode to erase the data stored therein in response to signals from microprocessor 14. When it is desired to erase EEPROM 12, the signal at I/O output port leads 18 and 20 go active (low), thereby causing circuit 19 to raise the voltage at VPP pin 30 and at address pins 21 of EEPROM 12 to about 12 volts. The presence of 12 volts at pins 21 is sensed by EEPROM 12, which responds by erasing the data stored therein. Unfortunately, circuit 19 represents several additional integrated circuits within circuit 10, thereby adding to the expense of circuit 10. In addition, the circuit 19 must be able to withstand high voltages, e.g. about 12 volts. Circuits of this nature tend to be slow, thereby impeding the speed of communication of addresses to EEPROM 12 and thus slowing circuit 10 during reading and writing operations.

Another method of causing EEPROM 12 to enter the erase mode would be to add an extra pin to EEPROM 12 for receiving an erase command signal from microprocessor 14. However, providing extra pins in an EEPROM is expensive and undesirable.

SUMMARY OF THE INVENTION

In accordance with one novel feature of our invention, a decoder is provided within a flash EEPROM for monitoring the address bus of the EEPROM. When the programming voltage VPP pin of the EEPROM is raised to a high voltage, e.g. about 12 volts, the EEPROM decoder monitors the address bus for selected addresses. If, immediately after voltage VPP goes to 12 volts, the EEPROM receives a first predetermined address on the address bus (for example, address 2AAA (hexidecimal)), the decoder interprets the presence of this first predetermined address as an instruction to go into the erase mode. If, immediately after voltage VPP goes to 12 volts, the EEPROM receives a second predetermined address on the address bus (for example, address 5555 (hexidecimal)), the decoder interprets this second predetermined address as an instruction to go into the programming mode. The EEPROM then remains in either the erase mode or programming mode, as appropriate, until the voltage at the VPP pin is reduced, e.g. to 5 volts. If the EEPROM is in the programming mode, further addresses received on the address bus are interpreted as instructions to store data in the location within the EEPROM corresponding to the received address. It is noted that the above-described mechanism for controlling whether the EEPROM goes into the programming or erase modes does not require an extra pin on the EEPROM. Further, the EEPROM can be used in a circuit without requiring additional integrated circuits which drive EEPROM address lines with high voltages, and which also degrade the speed with which addresses are communicated to the EEPROM.

In accordance with another novel feature of our invention, when the EEPROM goes into the programming mode and receives a first address, the EEPROM causes an internally generated write signal to go active and remain active until the EEPROM is again accessed, at which time the internally generated write signal goes inactive. The amount of tim the internally generated write signal is active is software controlled. Between the time the EEPROM causes the write signal to go active and the time the write signal goes inactive, the microprocessor can execute other instructions and accomplish other tasks, and need not wait for the EEPROM to complete its task of storing data. Also, it is not necessary to provide an additional integrated circuit to generate a wait signal for the microprocessor.

The above-described technique for internally generating a write control signal is particularly useful in interfacing an EEPROM to a microprocessor. In another embodiment of our invention, this technique can be used to couple other devices to a microprocessor, such as slow peripheral I/0 devices or slow memory devices such as EEPROMs or magnetic data storage devices.

These and other features of the present invention are better understood with reference to the detailed description below.

DETAILED DESCRIPTION

Figure 2:
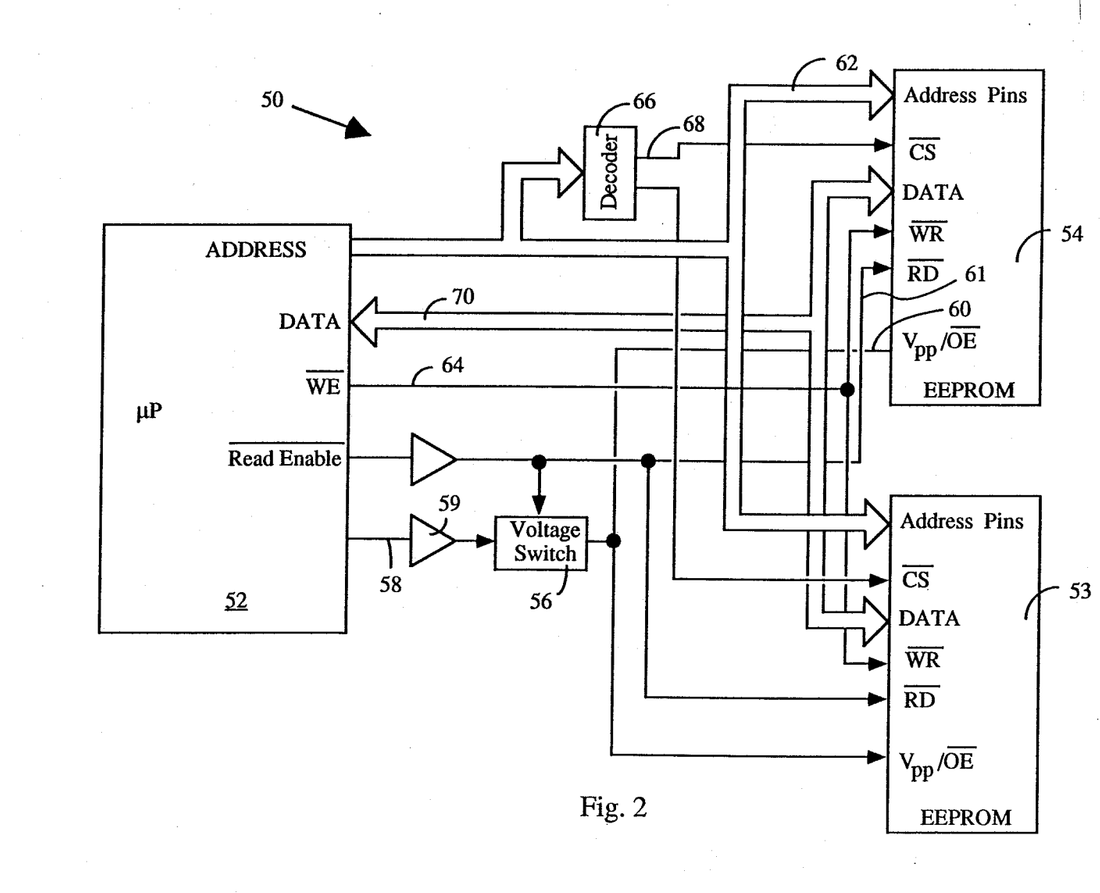
FIG. 2 schematically illustrates a circuit including an EEPROM constructed in accordance with our invention.
Figure 3:
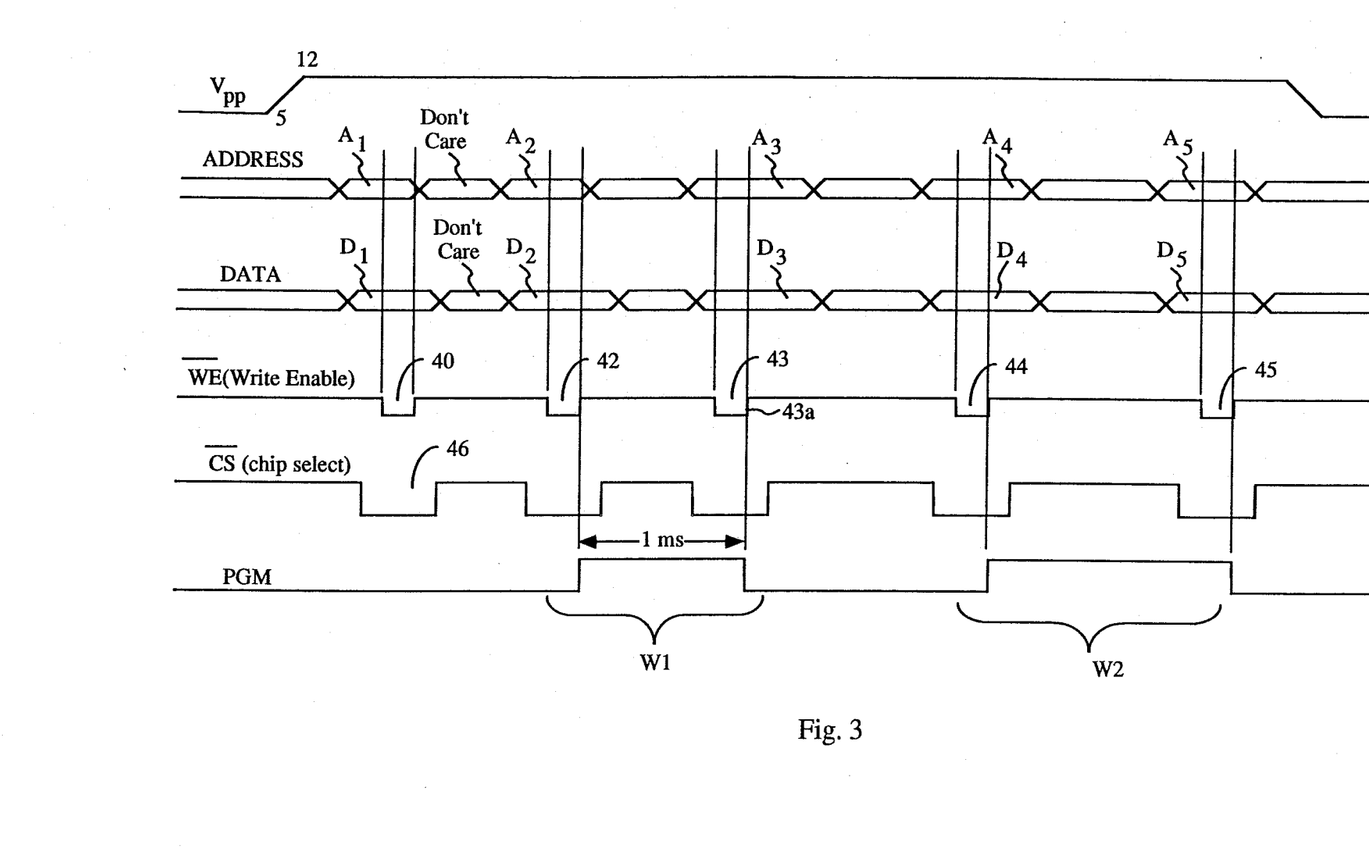
FIG. 3 is a timing diagram of signals received by an EEPROM constructed in accordance with one embodiment of our invention.

FIG. 2 schematically illustrates a circuit 50 including a microprocessor 52 which communicates with a flash EEPROM 54 in accordance with our invention. FIG. 3 illustrates the timing for the signals applied to EEPROM 54 by microprocessor 52. Referring to FIGS. 2 and 3, when it is desired to program EEPROM 54 (i.e. store data in EEPROM 54), microprocessor 52 applies a control signal to a VPP voltage switch 56 via a lead 58 and a buffer 59, thereby causing switch 56 to raise the voltage at VPP pin 60 of EEPROM 54, e.g., from 5 volts to about 12 volts. Thereafter, a first address A1 (FIG. 3) is provided on the address bus 62 of EEPROM 54. Microprocessor 52 also generates a first write enable pulse 40 on a write enable lead 64. In addition, an address decoder 66 coupled to the address bus of microprocessor 52 generates a chip select signal pulse 46 on a lead 68 when microprocessor 52 accesses EEPROM 54. When the chip select and write enable pulses are present at leads 64 and 68, EEPROM 54 stores address A1 on address bus 62 in a register 100 within EEPROM 54 (FIG. 4) and presents the latched address to a decoder 102. If latched address A1 is a first predetermined address (e.g. address 2AAA (hexidecimal)), the EEPROM interprets this as an instruction to enter the programming mode. If address A1 constitutes an instruction to enter the programming mode, EEPROM 54 remains in the programming mode until voltage VPP drops back to 5 volts. If latched address A1 is a second predetermined address (e.g. address 5555 (hexidecimal)), EEPROM 54 interprets this as an instruction to enter the erase mode. If address A1 constitutes an instruction to enter the erase mode, all the data in the EEPROM is erased and the EEPROM remains in the erase mode until voltage VPP drops back to 5 volts.

Although in one embodiment of our invention, address 2AAA indicates to EEPROM 54 that it is to enter the programming mode and address 5555 constitutes an instruction to enter the erase mode, in other embodiments of our invention, other addresses or blocks of addresses are used to instruct the EEPROM to enter either the erase mode or the programming mode.

It is noted that EEPROM 54 ignores the contents of data bus 70 (FIG. 2) during first write pulse 40, regardless of the contents of address bus 62 during write pulse 40.

If address 2AAA (hexidecimal) is present on the address bus during pulse 40, when the next write pulse 42 is provided on write enable lead 64, EEPROM 54 latches a second address A2 from address bus 62 on the falling edge of pulse 42 and latches data D2 on data bus 70 on the rising edge of pulse 42. The EEPROM then stores latched data D2 at the location within EEPROM 54 corresponding to address A2. Concurrently with the rising edge of write enable pulse 42, a toggle flip-flop within EEPROM 54 (described below) causes a write signal PGM to go active. Signal PGM remains active until EEPROM 54 receives another write pulse 43. When the rising edge 43a of pulse 43 is received by the EEPROM, signal PGM goes low, thereby concluding the end of a first write cycle W1. Signal PGM is an internally generated write control pulse, and during write cycle W1, EEPROM 54 stores data D2 while signal PGM is active. It is noted that during pulse 43, the EEPROM receives an address A3 and data D3. Address A3 and data D3 are not typically used by EEPROM 54. However, the software controlling microprocessor 52 typically causes address A3 to equal address A2 and data D3 to equal data D2. Because of this, new address and data information are not stored in the address and data latches within the EEPROM. This avoids causing the signals from buffers within the EEPROM from changing state at a time when the buffers are driving these signals with logic levels of zero and 12 volts.

Of importance, between the time microprocessor 52 provides pulses 42 and 43, microprocessor 52 need not wait for EEPROM 54 to finish write cycle W1. Instead, microprocessor 52 can be accomplishing other tasks such as storing data in another EEPROM 53 or accessing other memory or peripheral devices (not shown).

After first write cycle W1, if voltage VPP goes from 12 volts to 5 volts, the EEPROM exits the programming mode. However, if voltage VPP remains at 12 volts, the EEPROM remains in the programming mode. Thus, if EEPROM 54 receives a fourth write pulse 44, a new address A4 and new data D4, signal PGM again goes high and a new write cycle W2 starts. Write cycle W2 continues until EEPROM 54 receives a fifth pulse 45 from write enable lead 64.

It is noted that in the above-described embodiment, during write pulse 40, address 2AAA is interpreted as a special instruction address to indicate that the programming mode is to begin. However, data can still be stored at address 2AAA within EEPROM 54 because during subsequent write pulses 42 and 44, if addresses A2 or A4 equals 2AAA (hexidecimal), data D2 or data D4 will be stored at location 2AAA (hexidecimal) as appropriate. Thus, during write pulses 42 and 44, address 2AAA (hexidecimal) is interpreted merely as indicating a location where data is to be stored. Similarly, if during pulses 42 and 44, addresses A2 or A4 equal 5555 hexidecimal), EEPROM 54 responds by storing data D2 or D4, as appropriate, at address 5555.

In the embodiment of FIG. 2, pin 60 serves as both a VPP power supply pin and an output enable pin. Thus, when the voltage at pin 60 is held at ground, and read enable pin 61 is held low, data is read from EEPROM 54. However, in other embodiments, a separate VPP input pin and output enable pin are provided on the EEPROM.

Figure 4:
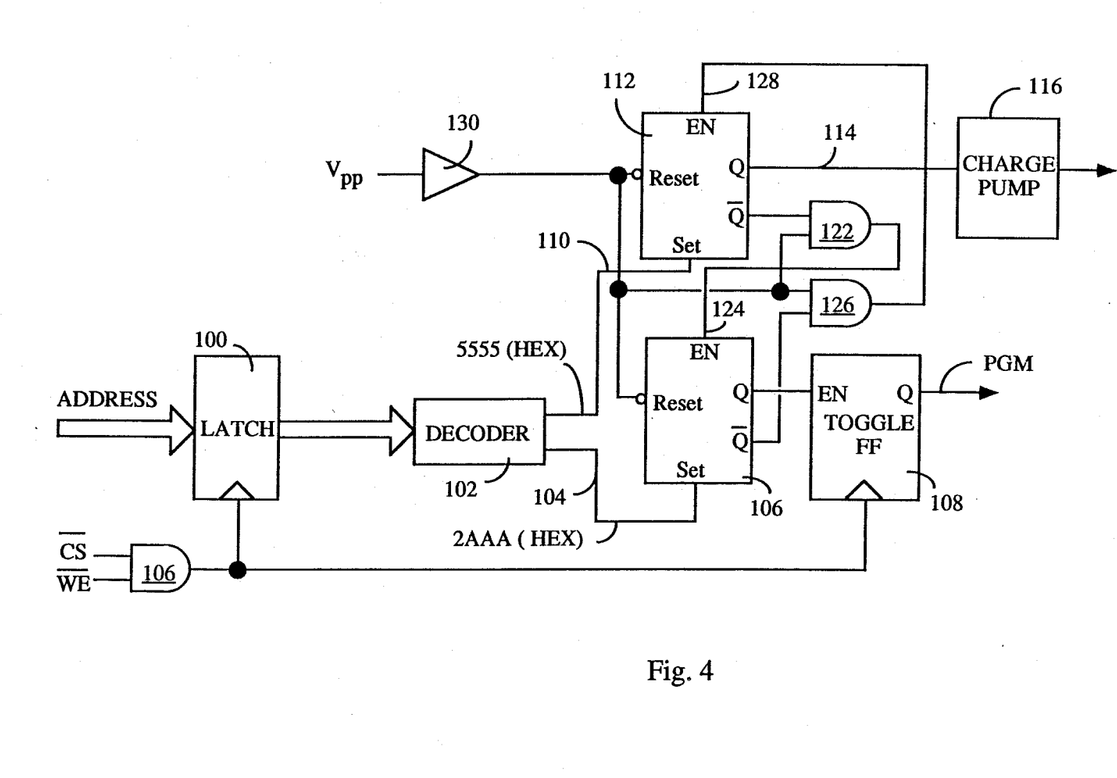
FIG. 4 is a block diagram of control circuitry within an EEPROM in accordance with our invention.

FIG. 4 is a block diagram of control logic within EEPROM 54. As can be seen, when chip select signal $\overline{CS}$ is active (low) and EEPROM 54 receives write enable pulse 40, an AND gate 106 applies a clock pulse to latch 100, thereby causing latch 100 to store address A1. Address A1 is presented to decoder 102 which generates an output signal on an output lead 104 if address A1 equals 2AAA (hexidecimal), thereby setting a flip-flop 106 (i.e., causing the Q output signal of flip-flop 106 to go high), and enabling a toggle flip-flop 108. Of importance, toggle flip-flop 108 provides write control signal PGM. Thus, when pulse 42 is received by EEPROM 54, AND gate 106 applies a clock pulse to toggle flip-flop 108, thereby causing output signal PGM of flip-flop 108 to change state and go active. When pulse 43 is received by EEPROM 54, AND gate 106 generates another pulse to toggle flip-flop 108 to cause signal PGM to go inactive. In this way, when the Q output signal from flip-flop 106 is high, each time EEPROM 54 concurrently receives both a write pulse and a chip select pulse, signal PGM changes state.

If address A1 equals 5555 (hexidecimal), decoder 102 generates a signal on a lead 110 which causes flip-flop 112 to generate an erase signal on a Q output lead 114. The erase signal is received by a charge pump 116, which generates an erase voltage for erasing the EEPROM in response thereto. (Charge pumps are circuits which receive a first voltage, e.g. 12 volts, and generate therefrom larger voltages.)

In the embodiment of FIG. 4, if address A1 does not equal 2AAA (hexidecimal) or 5555 (hexidecimal), EEPROM 54 does not go into the erase or programming modes, and instead remains in the read mode until EEPROM 54 receives either address 2AAA or 5555.

It is noted that if address A1 equals 5555 (hexidecimal), the $\overline{Q}$ signal from flip-flop 112 goes low, causing the output signal from an AND gate 122 to go low, thus causing the voltage at an enable input lead 124 of flip-flop 106 to go low and preventing flip-flop 106 from changing state. Thus, if EEPROM 54 enters the erase mode, subsequent applications of address 2AAA (hexidecimal) to EEPROM 54 will not cause EEPROM 54 to enter the programming mode. Similarly, the $\overline{Q}$ signal from flip-flop 106 is presented to an AND gate 126 which drives an enable input lead 128 of flip-flop 112. Thus, if address A1 equals 2AAA (hexidecimal), subsequent applications of address 5555 (hexidecimal) will not set flip-flop 112 and cause EEPROM 54 to enter the erase mode.

Voltage VPP is presented to a buffer 130, the output lead of which is coupled to the reset input leads of flip-flops 106 and 112. When voltage VPP is at 12 volts, the output signal from buffer 130 is high, and thus flip-flops 106 and 112 are not reset by buffer 130. However, if voltage VPP drops to 5 volts, flip-flops 106 and 112 receive rest signals, and EEPROM 54 enters the read mode.

The output signal from buffer 130 is coupled to AND gates 122 and 126. Thus, after the output signal from buffer 130 goes low, flip-flops 106 and 112 will not change state in response to addresses received by EEPROM 54.

While in the above-described embodiment, address A1 controls whether EEPROM 54 is to enter the programming or erase modes, in other embodiments, both address A1 and data D1 are decoded. EEPROM 54 goes into the erase mode if address A1 equals a first predetermined value and data D1 equals a second predetermined value. EEPROM 54 goes into the programming mode if address A1 equals a third predetermined value and data D1 equals a fourth predetermined value. In yet another embodiment, only data D1 is decoded to control whether EEPROM 54 enters the programming or erase modes.

It is noted that the application of addresses A1 through A5, data D1 through D5, and write enable pulses 40 through 45 are typically applied to the EEPROM from the microprocessor under software control. Thus, no additional integrated circuits are required to indicate to the EEPROM that it is to enter the programming or erase mode. In addition, a feedback circuit is not required to halt the microprocessor to allow time for the microprocessor to go into the wait state. In fact, between application of pulses 42 and 43 to EEPROM 54, microprocessor 52 need not enter a wait state. Thus, circuit 50, including EEPROM 54, is more efficient than prior art circuit 10 because microprocessor 50 can perform other tasks while data is being stored in EEPROM 54. Further, circuit 50 is less expensive to construct and more reliable than prior art circuit 10 because circuit 50 does not require additional integrated circuits for driving selected address pins of EEPROM 54 with large voltages (e.g. about 12 volts). In addition, the speed of the circuit of FIG. 2 is not impeded by the presence of such additional integrated circuits coupled to the EEPROM address bus.

While the present invention has been disclosed with regard to specific embodiments, those skilled in the art will recognize that changes can be made in form and detail without departing from the spirit and scope of the invention. For example, instead of having decoder 102 which provides a first output signal on lead 104 if address A1 is a first value and a second output signal on lead 110 if address A1 is a second value, a decoder can be used which provides a first output signal if address A1 is a first value, but provides the second output signal merely if address A1 does not equal the first value. Thus, in one embodiment, a decoder is used which provides an active signal on lead 104 if address A1 equals 2AAA (hexadecimal), but provides an active signal on lead 110 if address A1 equals any value other than 2AAA (hexadecimal). Accordingly, all such changes come within the present invention.

We claim:

1. An EEPROM formed in an integrated circuit and adapted to be either a read mode, a programming mode or an erase mode, said EEPROM comprising:
    means for receiving an address;
    decode means coupled to said means for receiving for determining whether said received address an address corresponding to an instruction to enter the programming mode, said code means also determining whether said received address is an address corresponding to an instruction to enter said erase mode;
    programming means coupled to said decode means for causing said EEPROM to go into said programming mode in respond to said decode means determining that said received address is an address corresponding to an instruction to enter said programming mode;
    erase means coupled to said decode means for causing said EEPROM to go into said erase mode in response to said decode means determining that said received address is an address corresponding to an instruction to enter said erase mode.

2. The EEPROM of claim 1 further comprising a lead coupled to aid programming means and erase means for receiving a programming voltage, said programming means and erase means being enabled in response to the voltage at said lead going from a first level to a second level, so that said programming means and erase means can cause said EEPROM to go into said programming mode or erase mode, and wherein said programming mean and erase means cause said EEPROM to go back into said read mode in response to the voltage at said lead going from said second level to said first level.

3. An EEPROM formed in an integrated circuit for being in either a read mode, a programming mode or an erase mode, said EEPROM comprising:
    a data bus including at least one data input lead for receiving data;
    data bus decode means for determining whether the data on said data bus is a value corresponding to an instruction to enter the programming mode, said data bus decode means also determining whether the data on said data bus is a value corresponding to an instruction to enter said erase mode;
    programming means coupled to aid data bus decode means for causing said EEPROM to go into said programming mode in response tot said data bus decode means determining that the data on said data bus is a value corresponding to an instruction to enter said programming mode; and
    erase means coupled to said data bus decode means for causing said EEPROM to go into said erase mode in response to said data bus decode means determining that the data on said data bus is a value corresponding to instruction to enter said erase mode.

4. An erasable programmable memory adapted to being either a read mode, a programming mode, or an erase mode, said memory comprising:
    a data bus for receiving data;
    an address bus for receiving an address;
    address decode means coupled to said address bus for decoding said received address; and
    program and erase means coupled to said address decode means for causing said memory to go into said programming mode in response to the address on said address bus decoded by said address decode means when said address on said address bus is a value interpreted by said address decode means as an instruction to enter said programming mode, said program and erase means causing said memory to go into said erase mode in response to the address on said address bus decoded by said address decode means being a value interpreted by said address decode means as an instruction to enter said erase mode, and wherein if
    (a) said memory is in said programming mode, and
    (b) said memory receives an address on said address bus and data on said data bus, then
    (c) said memory stores said data in a location corresponding to said received address, even if said received address would have been interpreted as an instruction to enter said programming or erase mode had said memory not already been in said programming mode.

5. An erasable programmable memory for being in read mode, a programming mode, or an erase mode, said memory comprising:
    an address bus for receiving addresses;
    a data bus including at least one data input lead for receiving data;
    data bus decode means coupled to said data bus for decoding said received data; and
    program and erase means coupled to said data bus decode means for causing said memory to go into said programming mode in response to the data on said data bus decoded by said data bus decode means when said data bus decode means as an instruction to enter said programming mode, said program and erase means causing said memory to go into said erase mode in response to the data on said data bus being a value interpreted by said data bus decode means as an instruction to enter said erase mode, and wherein if
    (a) said memory is in said programming mode, and
    (b) said memory received an address on said address bus and data on said data bus,
    (c) aid memory stores dad received data in a location within said memory corresponding to said received address, even when said received data would have been interpreted as an instruction to enter either said programming or erase mode had said memory not already been in said programming mode.

6. Memory of claim 5 further comprising:
address decode means coupled to said address bus for decoding said received address, wherein said program and erase means is also coupled to said address decode means, and causes said memory to go into either said programming mode or erase mode in response to both the address on said address bus decoded by said address decode means and the data on said bus decoded by said data bus decode means.

7. A memory device comprising:
first mean for receiving a first write signal;
second means for receiving data;
third means coupled to said first means for generating a second write signal, said third means causing said second write signal to go active in response to said first write signal going active a first time, said third means causing said second write signal to go inactive in response to said first write signal going active a second time after said first time; and
memory means coupled to said second and third means for storing said received data in response to said second write signal.

8. The EEPROM of claim 1 wherein said programming means causes said EEPROM to go into said programming mode in response to said decode means determining that said received address is one of a plurality of addresses.

9. The EEPROM of claim 1 wherein said erase mean causes said EEPROM to go into said erase mode in response to said decode means determining that said received address is one of a plurality of predetermined addresses.

10. The EEPROM of claim 3 wherein said programming mean causes said EEPROM to go into said programming mode in response to said data bus decode means determining that said received data is one of a plurality of values.

11. The EEPROM of claim 3 wherein said erase means causes said EEPROM to go into said erase mode in response to said data bus decode means determining that said received data is one of a plurality of values.

12. A memory device comprising:
address bus means for receiving addresses;
data bus mean for receiving data;
control means coupled to said address bus means for generating a signal, said signal going active when said address bus mean receives a first address, said signal going inactive when said address bus means receives a second address after receiving said first address; and
memory means coupled to said control means and said data bus means for storing said received data in response to said signal.

13. The memory device of claim 12 wherein said first address equals said second address.

14. The memory device of claim 12 wherein said first and second addresses are provided by a microprocessor, said microprocessor performing tasks during the period between the times sad first and second addresses are provided.

15. A method for controlling an EEPROM, said EEPROM having an address bus and a data bus, said method comprising the steps of:
receiving an address on said address bus;
causing said EEPROM to go into a programming mode if said address equals a first value;
causing said EEPROM to go into an erase mode if said received address is a second value; and
providing additional addresses on said address bus and providing additional data on said data bus, whereby when said EEPROM is in said programming mode, said EEPROM stores said data in locations within said EEPROM corresponding to said additional addresses, even if one of said additional addresses equals said first or second value.

16. The method of claim 15 further comprising the steps of:
causing said EEPROM t go into said programming mode if said address is within a first plurality of predetermined values; and
causing said EEPROM to go into an erase mode if said address is within a second plurality of predetermined values.

17. A method for storing said in a device comprising the steps of:
receiving a first address;
receiving data;
causing a write signal to go active in response to receipt of said first address;
storing said data in said device in response to said write signal going active;
receiving a second address; and
causing said write signal to go inactive in response to receipt of said second address.

18. A method for controlling an EEPROM, said EEPROM having a data bus including at least one data lead, said EEPROM also including an address bus, said method comprising the steps of:
receiving data on said data bus;
causing said EEPROM to go into a programming mode if said data equals a first value;
causing said EEPROM to go into an erase mode if said received data is a second value; and
providing additional data to said EEPROM on said data bus and providing addresses to said EEPROM on said address bus, whereby when said EEPROM is in said programming mode, said EEPROM will store data from said data bus in locations within said EEPROM corresponding to said received addresses, even when said received data equals said first or second value.

19. Method of claim 18 further comprising the steps of:
causing said EEPROM to go into said programing mode if said data is within said first plurality of predetermined values, and
causing said EEPROM to go into said erase mode if said data is within a second plurality of predetermined values.

20. EEPROM of claim 3 comprising:
an address bus for receiving an address; and
address decode means coupled to said address bus for decoding said received address, wherein said programming means and erase means is also coupled to said address decode means, and causes said EEPROM to go into either said programming mode or erase mode in response to both the address on said address bus decoded by said address decode means and the data on said data bus decoded by said data bus decode means.

* * * * *

UNITED STATES PATENT AND TRADEMARK OFFICE
CERTIFICATE OF CORRECTION

PATENT NO. : 4,970,692
DATED : November 13, 1990
INVENTOR(S) : Syed Ali and Yoram Cedar It is certified that error appears in the above-identified patent and that said Letters Patent is hereby corrected as shown below:

Column 7,
Line 33, after "address" should be -- is --
Line 35, "code" should be -- decode --
Line 41, "respond" should be -- response --
Line 51, "aid" should be -- said --
Line 58, "mean" should be -- means --

Column 8,
Lines 4 and 67, "aid" should be -- said --
Line 6, "tot" should be -- to --
Line 14, after "corresponding to" insert -- an --
Line 57, after "data" should be -- on said data bus is a value interpreted by said data --
Line 65, "received" should be -- receives --
Line 67, "dad" should be -- said --

Column 9,
Line 6, before "Memory" insert -- The --
Line 11, after "or" insert -- said --
Lines 16, 33, 39, 49 and 52, "mean" should be -- means --
Line 64, "sad" should be -- said --

Column 10,
Line 15, "t" should be -- to --
Line 21, "said" should be -- data --
Line 49, before "Method" insert -- The --
Line 51, "programing" should be -- programming --

Signed and Sealed this

Fourteenth Day of December, 2004

JON W. DUDAS
*Director of the United States Patent and Trademark Office*